United States Patent
Tada et al.

(10) Patent No.: US 9,504,154 B2
(45) Date of Patent: Nov. 22, 2016

(54) SEMICONDUCTOR DEVICE

(71) Applicant: FUJI ELECTRIC CO., LTD., Kawasaki-shi (JP)

(72) Inventors: Shinji Tada, Hino (JP); Eiji Mochizuki, Hino (JP); Hideyo Nakamura, Hino (JP); Masafumi Horio, Hino (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 0 days.

(21) Appl. No.: 14/288,825

(22) Filed: May 28, 2014

(65) Prior Publication Data
US 2014/0355219 A1 Dec. 4, 2014

(30) Foreign Application Priority Data

Jun. 4, 2013 (JP) .................................. 2013-117916

(51) Int. Cl.
| H05K 7/00 | (2006.01) |
| H05K 1/11 | (2006.01) |
| H01L 23/00 | (2006.01) |
| H05K 1/02 | (2006.01) |
| H05K 1/18 | (2006.01) |
| H05K 3/32 | (2006.01) |

(52) U.S. Cl.
CPC ............... *H05K 1/117* (2013.01); *H01L 24/01* (2013.01); *H05K 1/0263* (2013.01); *H01L 2924/12042* (2013.01); *H01L 2924/1305* (2013.01); *H01L 2924/13055* (2013.01); *H01L 2924/13091* (2013.01); *H05K 1/181* (2013.01); *H05K 3/328* (2013.01); *H05K 2201/10166* (2013.01); *H05K 2201/10272* (2013.01); *H05K 2201/10303* (2013.01)

(58) Field of Classification Search
USPC ....... 361/714, 728–730, 752, 775, 784, 796, 361/800; 257/762, 773, E23.024, E21.499, 257/E21.214, E21.24
See application file for complete search history.

(56) References Cited

U.S. PATENT DOCUMENTS

| 4,729,744 A | 3/1988 | Bet et al. |
| 5,202,578 A | 4/1993 | Hideshima |
| 5,408,128 A | 4/1995 | Furnival |
| 5,430,326 A | 7/1995 | Miyashita |

(Continued)

FOREIGN PATENT DOCUMENTS

| EP | 2284889 A1 | 2/2011 |
| JP | 6286900 A | 4/1987 |

(Continued)

*Primary Examiner* — Hung S Bui
(74) *Attorney, Agent, or Firm* — Rossi, Kimms & McDowell LLP

(57) ABSTRACT

A semiconductor device composed of a plurality of semiconductor modules exhibiting a large current carrying capacity for a semiconductor device as a whole is disclosed. The connection between the plurality of semiconductor modules is conducted by means of optimum construction suited to the semiconductor device. The device comprises a semiconductor module having externally connecting terminals protruding out of a casing, bus bars electrically connecting the specific externally connecting terminals of the plurality of semiconductor modules arranged in parallel with each other, and a semiconductor module case covering and fastening the plurality of semiconductor modules connected with the bus bars. The bus bars and the externally connecting terminals of the semiconductor modules are joined by means of laser welding.

8 Claims, 17 Drawing Sheets

(56) References Cited

U.S. PATENT DOCUMENTS

| | | | |
|---|---|---|---|
| 5,763,946 A * | 6/1998 | Nakadaira et al. | 257/693 |
| 5,927,504 A | 7/1999 | Han et al. | |
| 8,164,176 B2 * | 4/2012 | Siepe et al. | 257/703 |
| 8,405,206 B1 * | 3/2013 | Duetemeyer et al. | 257/724 |
| 8,410,640 B2 * | 4/2013 | Gotou | 307/147 |
| 8,526,199 B2 | 9/2013 | Matsumoto et al. | |
| 8,710,666 B2 * | 4/2014 | Tsuruoka et al. | 257/773 |
| 2004/0248330 A1 | 12/2004 | Kitabatake et al. | |
| 2005/0093137 A1 | 5/2005 | Ishikawa et al. | |
| 2006/0067059 A1 * | 3/2006 | Ushijima et al. | 361/715 |
| 2007/0183130 A1 | 8/2007 | Yamabuchi et al. | |
| 2007/0242584 A1 | 10/2007 | Chan | |
| 2008/0150102 A1 * | 6/2008 | Yokomae et al. | 257/675 |
| 2008/0284007 A1 | 11/2008 | Horio et al. | |
| 2008/0290506 A1 | 11/2008 | Aoki et al. | |
| 2009/0085219 A1 * | 4/2009 | Bayerer | 257/776 |
| 2010/0039843 A1 | 2/2010 | Takizawa | |
| 2010/0127371 A1 | 5/2010 | Tschirbs | |
| 2010/0128441 A1 | 5/2010 | Soda et al. | |
| 2010/0149774 A1 | 6/2010 | Matsumoto et al. | |
| 2011/0156797 A1 * | 6/2011 | Ninomiya et al. | 327/482 |
| 2011/0203967 A1 | 8/2011 | Starovecky | |
| 2011/0221268 A1 * | 9/2011 | Kanazawa et al. | 307/10.1 |
| 2011/0273861 A1 | 11/2011 | Matsumoto et al. | |
| 2012/0008286 A1 | 1/2012 | Suzuki | |
| 2012/0241953 A1 | 9/2012 | Yamada et al. | |
| 2012/0256194 A1 | 10/2012 | Yoshihara et al. | |
| 2013/0062751 A1 | 3/2013 | Takagi et al. | |
| 2013/0154081 A1 | 6/2013 | Kadoguchi et al. | |
| 2014/0124936 A1 * | 5/2014 | Yanagawa et al. | 257/762 |
| 2014/0210067 A1 | 7/2014 | Takamiya et al. | |
| 2014/0346659 A1 | 11/2014 | Nakamura et al. | |
| 2014/0361424 A1 | 12/2014 | Horio et al. | |
| 2014/0367736 A1 | 12/2014 | Iizuka et al. | |

FOREIGN PATENT DOCUMENTS

| | | |
|---|---|---|
| JP | 63-130291 A | 6/1988 |
| JP | H04133391 A | 5/1992 |
| JP | H0594854 A | 4/1993 |
| JP | H05218252 A | 8/1993 |
| JP | H0613539 A | 1/1994 |
| JP | H07123738 A | 5/1995 |
| JP | 07-226240 | 8/1995 |
| JP | H07240497 A | 9/1995 |
| JP | H1093016 A | 4/1998 |
| JP | 2001036005 A | 2/2001 |
| JP | 2001-219270 A | 8/2001 |
| JP | 2002-025639 A | 1/2002 |
| JP | 3430192 B2 | 7/2003 |
| JP | 2003289130 A | 10/2003 |
| JP | 2004289103 A | 10/2004 |
| JP | 2005065414 A | 3/2005 |
| JP | 2006081308 A | 3/2006 |
| JP | 2006081312 A | 3/2006 |
| JP | 2006332291 A | 12/2006 |
| JP | 2007194442 A | 8/2007 |
| JP | 2007209184 A | 8/2007 |
| JP | 4093129 B2 | 3/2008 |
| JP | 4129027 B2 | 7/2008 |
| JP | 2008193779 A | 8/2008 |
| JP | 2008294069 A | 12/2008 |
| JP | 2009-070988 A | 4/2009 |
| JP | 2010103222 A | 5/2010 |
| JP | 2010103343 A | 5/2010 |
| JP | 2010245096 A | 10/2010 |
| JP | 2010251772 A | 11/2010 |
| JP | 2011-142124 A | 7/2011 |
| JP | 2011233606 A | 11/2011 |
| JP | 2012-004346 A | 1/2012 |
| JP | 2012-146604 A | 8/2012 |
| JP | 2012-182614 A | 9/2012 |
| WO | 2008142758 A1 | 11/2008 |
| WO | 2011083737 A1 | 7/2011 |
| WO | 2012029164 A1 | 3/2012 |
| WO | 2013145619 A1 | 10/2013 |
| WO | 2013145620 A1 | 10/2013 |
| WO | 2013146212 A1 | 10/2013 |

* cited by examiner

SEMICONDUCTOR DEVICE

BACKGROUND OF THE INVENTION

A. Field of the Invention

The present invention relates to a semiconductor device and in particular to a semiconductor device composed of a plurality of semiconductor modules comprising power semiconductor chips, using a technique for connecting terminals of semiconductor modules.

B. Description of the Related Art

A power semiconductor module contains a power semiconductor chip(s), for example an insulated gate bipolar transistor(s) (IGBT(s)), mounted on an insulated circuit board and housed in a case. One type of dedicated package is prepared for power semiconductor module of a specified current carrying capacity rating. A large capacity power semiconductor module can hardly be obtained by producing a dedicated chip for a given current carrying capacity. Thus, usually employed packages have a structure which arranges in parallel a plurality of power semiconductor chips with a specified current carrying capacity.

In a large capacity semiconductor module of silicon IGBT in a class of several hundred amps to 1,000 amps, a package includes several to several tens of semiconductor chips. In recent years, semiconductor modules using SiC semiconductor chips have been developed for composing an inverter. For the semiconductor modules using SiC semiconductor chips, which have generally small current carrying capacity, even a package with a current rating of from several tens of amps to 100 amps have a multiple of SiC semiconductor chips connected in parallel. Thus, producing a large capacity semiconductor module at a class of several hundred amps to 1,000 amps needs, in principle, several tens to several hundreds of SiC semiconductor chips arranged in parallel. This prevents the SiC semiconductor chips from commercial application.

In a semiconductor module completely dedicated to a certain current carrying rating, if only one chip or part becomes defective in the assembling process, the entire semiconductor module becomes defective and has to be discarded. In operation of the semiconductor module, if one chip or part breaks down, the entire semiconductor module must be replaced. Therefore, a dedicated package of large capacity, in particular, becomes costly for the manufacturers of the semiconductor module and risky for the users.

Some dedicated packages of large capacity semiconductor module comprise a multiple of medium capacity common parts in a unit with an insulated board, the common parts being arranged in parallel in the number necessary for providing a specified current capacity. The terminals and casing, on the other hand, are prepared in the arrangement and configuration just corresponding to the large current carrying capacity. A package composed of a multiple of medium capacity parts in a unit with an insulated board can avoid such discard of the entire semiconductor module that is caused by defective assembly at least up to the level of the insulated board unit. Nevertheless, in the later assembly steps and operation, breakdown of only one semiconductor chip or a part can result in discard and replacement of the entire semiconductor module.

Another approach achieves large capacity by arranging a number of discrete small capacity, small sized packages by mounting small amount of semiconductor chips and connecting with special attaching jig. Although the problem mentioned above does not take place in arrangement of many discrete small capacity, small-sized packages, new problems may arise in that the user attaches many parts or the user is forced to attach in a substantially different arrangement. In addition, the small size of package may fail to satisfy the insulation distance requirement.

An example of a dedicated package has the following structure. A plurality of semiconductor chips are connected and mounted on an insulated circuit board with solder. The semiconductor chips are wired to the insulated circuit board with bonding wires. A metallic base for heat dissipation is soldered to the surface of the insulated circuit board opposite to the surface on which the semiconductor chips are mounted. On the insulated circuit board, a bus bar including external terminals is connected and mounted with screw fitting or soldering. The metallic base for heat dissipation is fixed to a casing in which the semiconductor chip is sealed with gel filled in the casing. The external terminals of the bus bar project out of the casing. A dedicated package for use at temperatures above 200° C. preferably has a structure in which the semiconductor chip is sealed, in place of the gel, with resin molding that simultaneously works as a case. However, molding of a large sized semiconductor module can cause a problem of lowered yield rate due to occurrence of cracks and warp, and increased material costs.

It is difficult to connect a bus bar and another part by screwing if sufficient space cannot be secured around the bus bar. It is also difficult to connect them securely by soldering because the joining part cannot be made at a high temperature necessary for the soldering due to the high thermal conductivity of the material, for example copper, of the bus bar. If a large amount of heat is given to the joining part in order to carry out soldering, the heat through the joining part with the bus bar adversely affects the semiconductor module. Moreover, the soldering process, usually employing wire solder, can leave a residue of solder flux at the joint after the soldering process. The residue of flux is hardly cleaned altogether with the semiconductor module.

Patent Document 1 discloses a semiconductor device with various current carrying capacities of semiconductor modules obtained by solder joining externally led out terminals of semiconductor units and a wiring substrate having a wiring pattern formed thereon. The device of Patent Document 1, however, has the above-mentioned problem of flux residue because the joint is formed by soldering the externally led out terminals and the wiring substrate.

Patent Document 2 discloses a method of joining the base part of a terminal of an electronic component and a fine wire of lead wire by welding with electron beam or laser beam. The document, however, discloses only a method of joining a terminal and a lead wire, and does not mention about joining a bus bar of a semiconductor module and another part, for example, externally connecting terminals by means of the electron beam or laser beam welding.

Patent Document 3 discloses a method of joining a plate conductor and a wire by means of arc welding, especially tungsten inert gas (TIG) welding. However, when a bus bar of a semiconductor module and another part, for example, an externally connecting terminal are joined by means of the arc welding disclosed in Patent Document 3, this can adversely affect the semiconductor module through the terminal.

Patent Document 4 discloses a method of joining a printed circuit board and a junction terminal by putting a tab of the terminal through a through-hole of the board and then irradiating a pulse laser at the joint. The method, however, can only join a tab thinner than the body of the junction terminal, and does not join the junction terminal itself.

Patent Document 1—Japanese Unexamined Patent Application Publication No. 2011-142124

Patent Document 2—Japanese Unexamined Patent Application Publication No. S63-130291

Patent Document 3—Japanese Unexamined Patent Application Publication No. 2001-219270

Patent Document 4—Japanese Unexamined Patent Application Publication No. 2002-025639

The present invention is directed to overcoming or at least reducing the effects of one or more of the problems set forth above.

SUMMARY OF THE INVENTION

The present invention favorably solves the above problems and provides a semiconductor device that is composed of a plurality of semiconductor modules, each provided with power semiconductor chips to enlarge the current carrying capacity of whole the semiconductor device, in which the connections between the terminals of the semiconductor modules are performed through an optimum joining procedure for the semiconductor device.

A semiconductor device of an aspect of the present invention comprises: a plurality of semiconductor modules, each having one or more semiconductor chips mounted on an insulated circuit board and contained in a semiconductor module case, with externally connecting terminals connected to the semiconductor chips or the insulated circuit board protruding from the semiconductor module case; bus bars electrically connecting specific externally connecting terminals of the plurality of semiconductor modules arranged in parallel; and the semiconductor module case having through-holes for protruding external terminals that are portions of the bus bars, and covering and fastening the plurality of semiconductor modules that are connected by the bus bars; wherein the bus bars and the externally connecting terminals of the semiconductor modules are connected by means of laser welding.

A semiconductor device of another aspect of the present invention comprises: a plurality of semiconductor modules, each having one or more semiconductor chips mounted on an insulated circuit board, contained in a semiconductor module case, with externally connecting terminals connected to the semiconductor chips or the insulated circuit board protruding from the semiconductor module case; bus bars electrically connecting specific externally connecting terminals of the plurality of semiconductor modules arranged in parallel; a printed circuit board electrically connecting specific externally connecting terminals of the plurality of semiconductor modules, the specific externally connecting terminals being different from the externally connecting terminals connected to the bus bars; and the semiconductor module case having through-holes for protruding external terminals that are portions of the bus bars, and covering and fastening the plurality of semiconductor modules that are connected by the bus bars; wherein the printed circuit board and the externally connecting terminals of the semiconductor modules are connected by means of laser welding.

A semiconductor device of the present invention has a large current carrying capacity as a whole device by linking externally connecting terminals of a plurality of semiconductor modules each including power semiconductor chips, with bus bars and a printed circuit board. The connection between the externally connecting terminals of the semiconductor modules and the bus bars and the printed circuit board is carried out by laser welding. Therefore, the semiconductor chips are not affected by the connection process, and a solder flux cleaning process is not necessary eliminating one production step.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

The following describes details of a semiconductor device according to an embodiment of the present invention with reference to accompanying drawings.

Figure 1A:
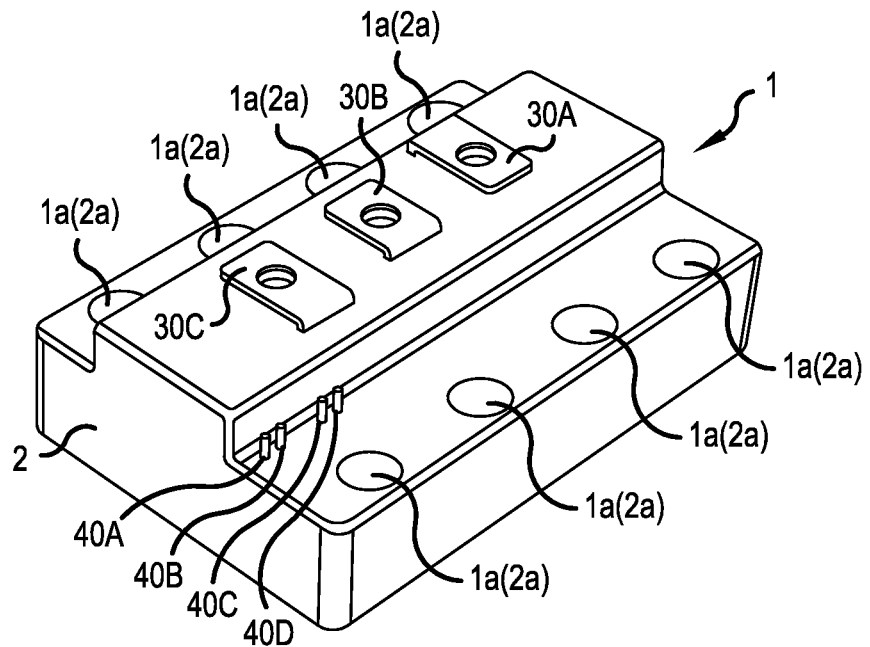
FIGS. 1A and 1B are perspective views of a semiconductor device according to an embodiment of the present invention.
Figure 1B:
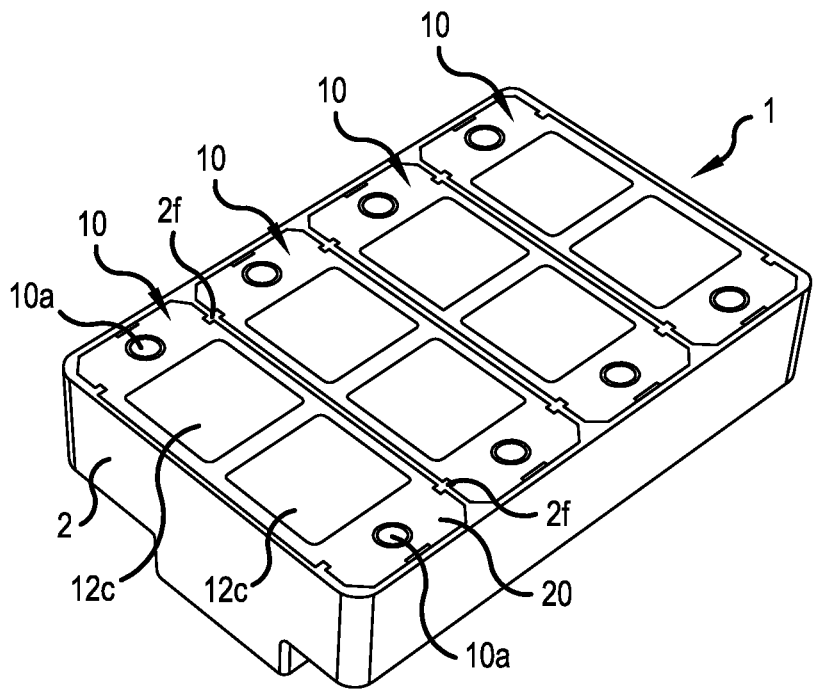

FIGS. 1A and 1B are perspective views of a semiconductor device 1 according to an embodiment of the invention, in which FIG. 1A is a view of the semiconductor device 1 seen obliquely from above, and FIG. 1B is a view of the semiconductor device 1 seen obliquely from below. As can be seen from FIG. 1B, the semiconductor device 1 comprises a multiple of (four in the example of the figure) power semiconductor modules 10 and a semiconductor module case 2 that covers and fixes the power semiconductor modules 10. As shown in FIG. 1A, the semiconductor device 1 has a configuration of a nearly rectangular parallelepiped with a side view from a shorter side having a projecting part. In the rectangular planar shape of the semiconductor device 1 of the figure, the longitudinal direction of the power semiconductor module 10 is the shorter side direction of the semiconductor device 1, and the direction of parallel arrangement of the multiple of power semiconductor modules 10 is the longitudinal direction of the semiconductor device 1. The semiconductor device 1 is provided with several vertically penetrating fitting holes 1a formed in the vicinity of the ends in the direction of the shorter side of the rectangular planar shape along the longitudinal direction of the semiconductor device. These fitting holes 1a correspond to fitting holes 10a (indicated in FIG. 1B, FIG. 3A, and FIG. 3B) provided in the semiconductor modules 10 arranged in parallel and composing the semiconductor device 1. The fitting holes 1a and the fitting holes 10a are arranged coaxially. The semiconductor device 1 is fitted to a device that uses the semiconductor device 1 using the fitting holes 10a formed in the power semiconductor modules 10. Consequently, the semiconductor module case 2 itself does not need rigidity around the fitting holes 2a in order to be fixed to the device.

On the top surface of the projecting part of the semiconductor device 1, three external terminals 30A, 30B, and 30C are exposed. The external terminals 30A, 30B, and 30C are used for main circuit terminals of the semiconductor device 1. On the surface of the shoulder surface beside the projecting part of the semiconductor device 1, four external terminals 40A, 40B, 40C, and 40D project out. These external terminals 40A, 40B, 40C, and 40D are terminals for control or instrumentation of the semiconductor chips of each semiconductor module 10 composing the semiconductor device 1. The external configuration and terminal shapes of the semiconductor device 1 illustrated in FIG. 1 are similar to those of general semiconductor modules.

Figure 2:
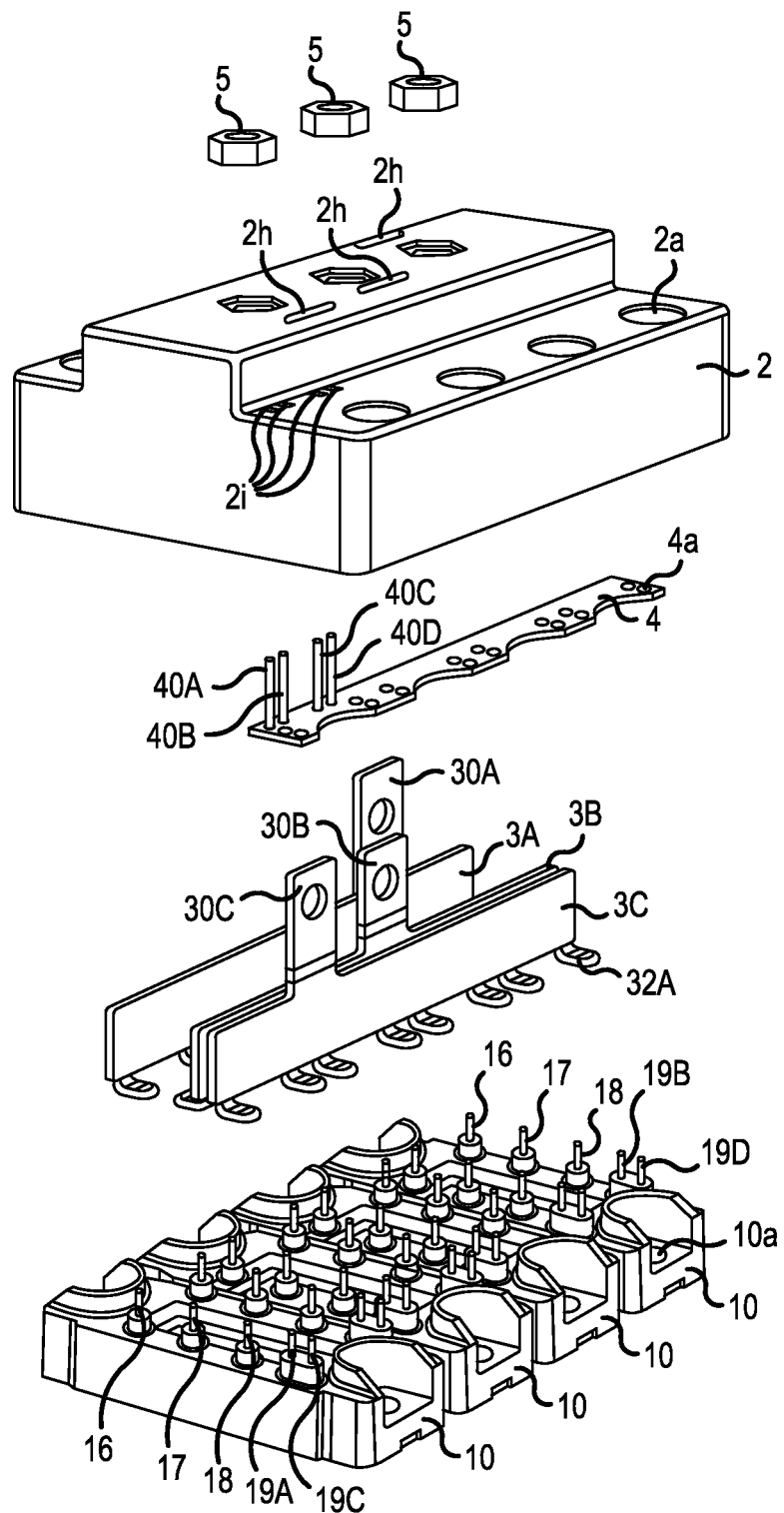
FIG. 2 is an exploded view of the semiconductor device of FIG. 1.

FIG. 2 is an exploded view of the semiconductor device 1. As shown in FIG. 2, the semiconductor device 1 comprises four semiconductor modules 10, the semiconductor module case 2, and further, three bus bars 3A, 3B, and 3C, and a printed circuit board 4. The external terminals 30A, 30B, and 30C are each parts of the bus bars 3A, 3B, and 3C, respectively. In the semiconductor module case 2 nuts 5 are embedded for combining with bolts or screws when the external terminals 30A, 30B, and 30C are electrically connected to other electronic components.

Figure 3A:
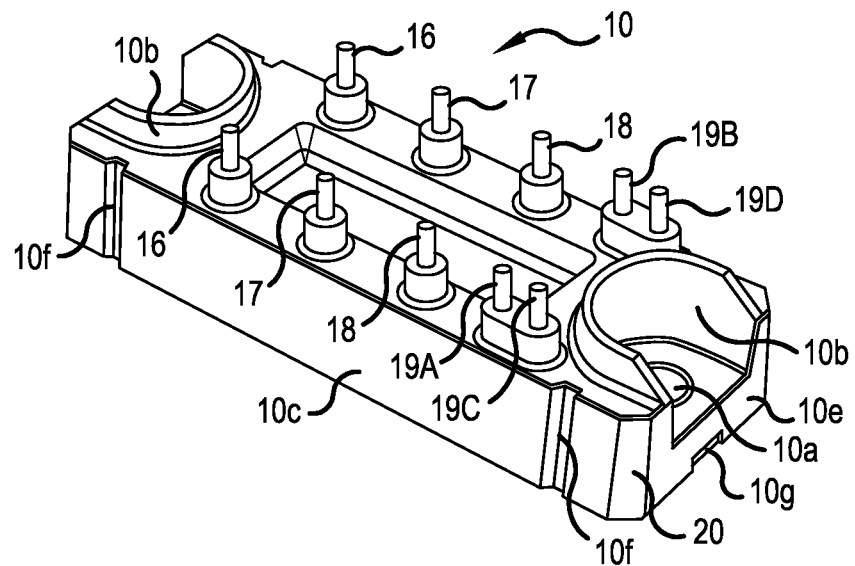
FIG. 3A and FIG. 3B are perspective views of a power semiconductor module composing the semiconductor device according to the embodiment of the present invention.
Figure 3B:
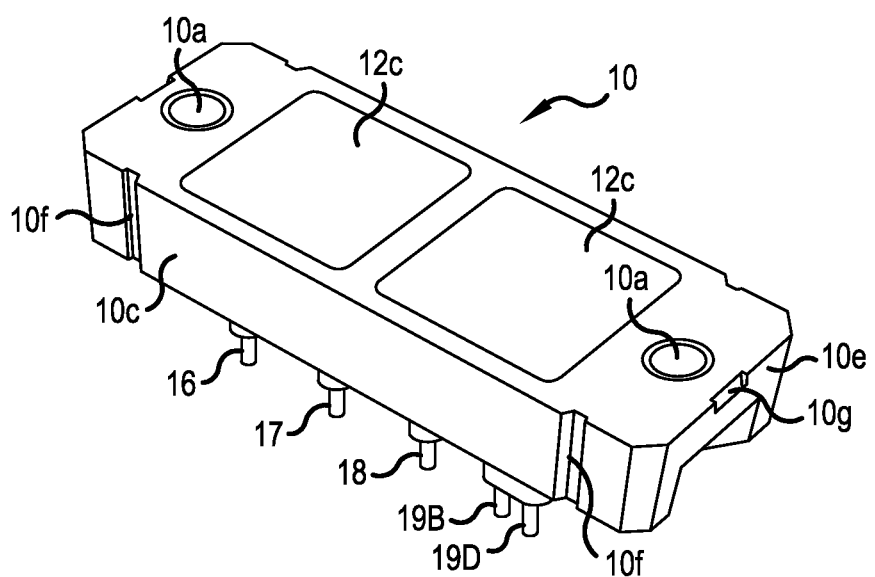

The plurality of power semiconductor modules 10 can have the same construction, and thus the following description is made in detail only on a representative power semiconductor module 10 referring to FIGS. 3A and 3B. FIG. 3A is a perspective view of the top surface seen obliquely from above and FIG. 3B is a perspective view of the bottom surface seen obliquely from below. The power semiconductor module 10 of FIGS. 3A and 3B has a configuration of a roughly rectangular parallelepiped. This external configuration of the power semiconductor module 10 of the embodiment example is formed by molding with thermosetting resin, for example, epoxy resin. The molded thermosetting resin seals semiconductor chips provided in the power semiconductor module 10 and simultaneously works as a casing 20 of the power semiconductor module 10.

Figure 4:
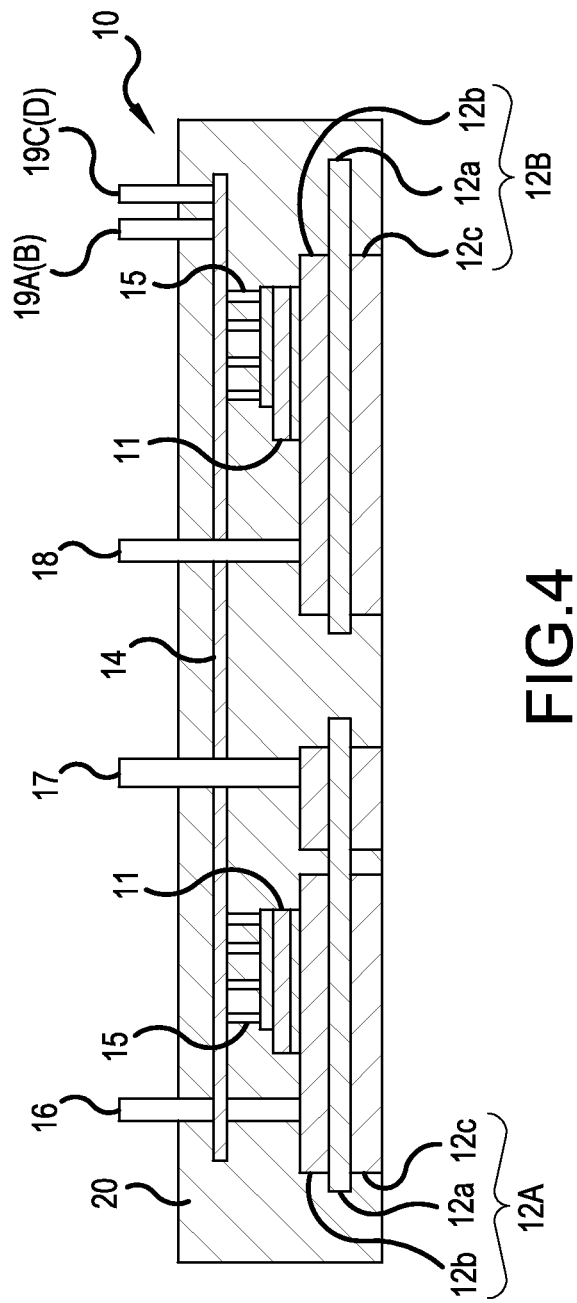
FIG. 4 is a schematic sectional view of a power semiconductor module.

FIG. 4 is a schematic sectional view of the internal structure of the power semiconductor module 10. In the example of power semiconductor module 10 as shown in FIG. 4, two semiconductor chips 11 are mounted on insulated circuit boards 12A and 12B by joining with solder. The semiconductor chip can be, for example, a power metal-oxide semiconductor field effect transistor (MOSFET) chip, an IGBT chip, or a free-wheeling diode (FWD) chip. The semiconductor chip 11 can be a silicon semiconductor chip or can be a SiC semiconductor chip. When the semiconductor chips 11 are power MOSFET chips, each of the insulated circuit board 12A and 12B has a semiconductor chip 11 of a power MOSFET chip and a FWD (not depicted in the figure) that is to be antiparallel-connected with the power MOSFET chip mounted on the insulated circuit board. Thus, the power semiconductor module 10 has a two-in-one unit structure and is used for one phase composed of upper and lower arms in an inverter, for example.

The insulated circuit board 12A and 12B each are composed of an insulating substrate 12a made from ceramics, and conductive layers 12b and 12c made from copper are provided on the surfaces of the insulating substrate 12a. The conductive layer 12b opposing the semiconductor chip 11 has a circuit pattern formed thereon. The bottom surface of the conductive layer 12c is coplanar with the bottom surface of the casing 20 made from a mold of thermosetting resin as shown in FIG. 4 or slightly protrudes out from the bottom surface of the casing 20.

A wiring substrate 14 having a predetermined circuit pattern is provided above the semiconductor chips 11. The wiring substrate 14 is electrically connected to the semiconductor chips 11 and the conductive layer 12b with conductive pins 15. A plurality of externally connecting terminals 16, 17, 18, 19A, 19B, and 19C are provided in connection to the wiring substrate 14 or to the conductive layer 12b. The externally connecting terminals 16, 17, and 18 are main circuit terminals: for example, the externally connecting terminal 16 is a drain-connecting terminal, the externally connecting terminal 17 is a source-connecting terminal, and the externally connecting terminal 18 is an output terminal. The externally connecting terminals 19A, 19B, 19C, and 19D are terminals for control or instrumentation.

The tips of the externally connecting terminals 16, 17, 18, 19A, 19B, 19C, and 19D protrude from the upper surface of the casing 20 molded with thermosetting resin of the power semiconductor module 10.

Each of the externally connecting terminals 16, 17, and 18 consists of two terminals at both ends in the transverse direction of the rectangular planar shape of the power semiconductor module 10 as shown in FIG. 3A. Each of the externally connecting terminals 19A, 19B, 19C, and 19D is provided at either end in the transverse direction of the power semiconductor module 10.

The fitting holes 10a are provided at both ends in the longitudinal direction of the power semiconductor module 10. The fitting holes 10a are formed vertically through the casing 20 of thermosetting resin of the power semiconductor module 10.

An insulating wall 10b is formed at each longitudinal end of the power semiconductor module 10 between the fitting hole 10a and the externally connecting terminals 16, 17, 18, 19A, 19B, 19C, and 19D. The insulating wall 10b of the power semiconductor module 10 shown in FIG. 3A is formed in a shape of a half circular tube around the fitting hole 10a. The insulating wall 10b prolongs the insulation distance between a bolt (not shown in the figure) inserted into the fitting hole 10a for fitting the power semiconductor module 10 and the externally connecting terminals 16, 17, 18, 19A, 19B, 19C, and 19D.

On the longitudinal side wall 10c of the power semiconductor module 10, guide grooves 10f are formed to guide the guide ribs 2f (indicated in FIG. 12) provided on the rear surface of the semiconductor module case 2. The guide grooves 10f are provided two on one side wall, summing up to four on both side walls in the example of FIGS. 3A and 3B. On the shorter side walls 10e of the power semiconductor module 10 around the connecting part with the bottom surface, recessed parts 10g are formed to engage with protruding parts 2g (indicated in FIG. 12) provided on the inner surface of the semiconductor module case 2.

Figure 5:
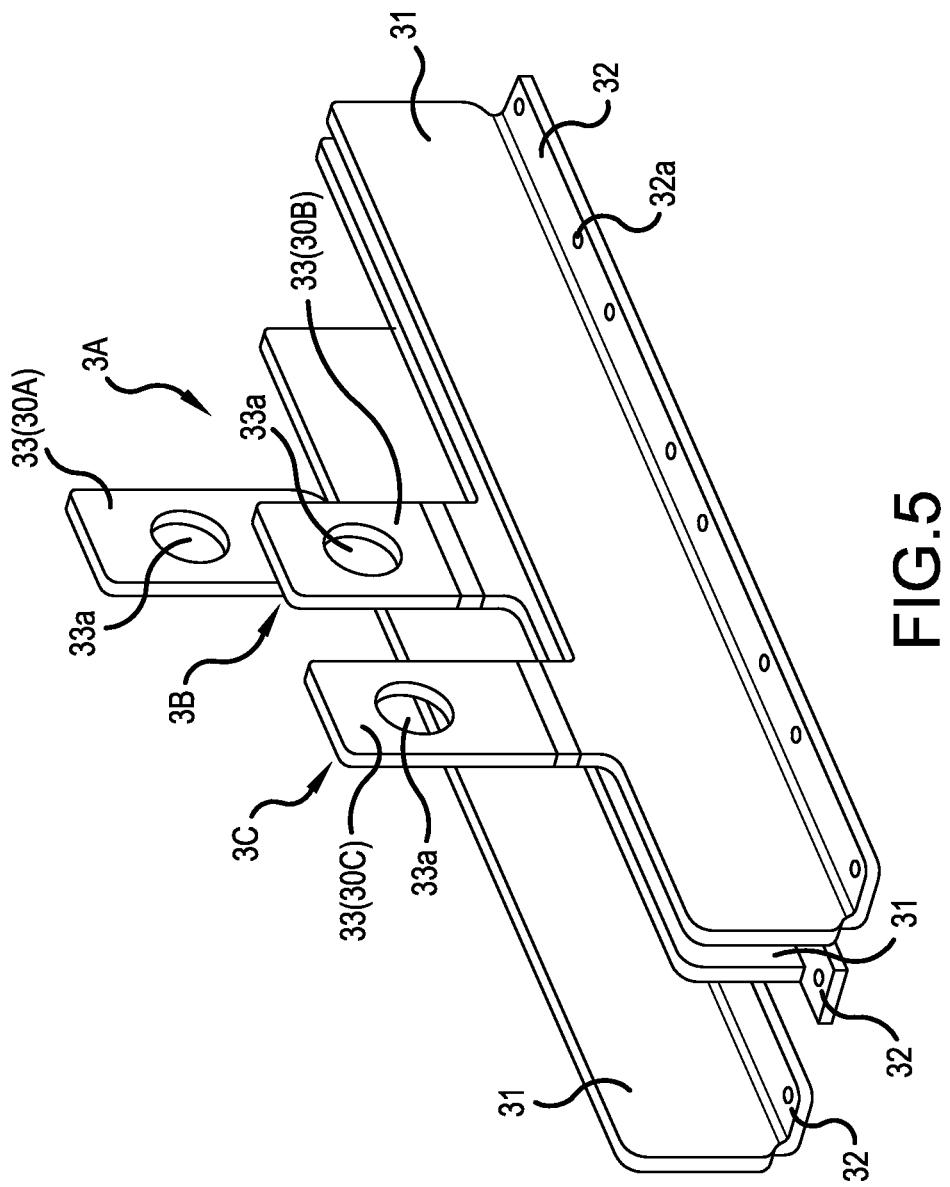
FIG. 5 is a perspective view of a bus bar in a semiconductor device according to an embodiment of the present invention.

The bus bars 3A, 3B, and 3C electrically connect the externally connecting terminals 16, 17, and 18 of the plurality of power semiconductor modules 10 arranged in parallel. FIG. 5 is a perspective view of the bus bars 3A, 3B, and 3C. Each of the bus bars 3A, 3B, and 3C has a body part 31 standing vertically, a joining part 32 formed folding at the bottom of the body part 31, and a terminal part 33 partly extending upward from the top of the body part 31 to become an external terminal 30A, 30B, or 30C of the semiconductor device 1. The terminal part 33 is provided with a through-hole 33a for a bolt (not shown in the figure) to screw-join a nut 5 (indicated in FIG. 3) embedded in the semiconductor module case 2. The joining part 32 can have a shape longitudinally extending like the body part 31 as shown in FIG. 5 or a shape 32A for just connecting to the specific terminal of the power semiconductor module 10 as shown in FIG. 2.

The bus bars 3A, 3B, and 3C are formed of a metal plate exhibiting good electric conductivity, for example a copper plate or an aluminum plate. Copper and copper alloy are preferable because of their low resistivity. The copper and copper alloy, however, exhibit a low absorption coefficient for laser light as compared with steel and aluminum. Thus, laser welding is difficult under normal welding conditions, which needs equipment of high output power and consequently high equipment cost. Therefore, the bus bars 3A, 3B, and 3C preferably are plated at least on the surface of the joining part 32. The plating enhances the absorption coefficient of laser light to facilitate laser welding. The output power for welding is reduced and the selection range for welding devices is expanded, restraining equipment costs. The types of plating include nickel plating, nickel alloy plating, gold plating, silver plating, copper alloy plating, chrome plating, and iron plating. Among them, nickel plating is preferable.

The bus bars 3A, 3B, and 3C are long enough to extend over the externally connecting terminals 16, 17, and 18 of the plurality of power semiconductor modules 10 arranged in parallel. The bus bar 30A is electrically connected to the externally connecting terminals 16 of the power semiconductor modules 10 at the joining parts 32. The bus bar 30B is electrically connected to the externally connecting terminals 17 of the power semiconductor modules 10 at the joining parts 32. And the bus bar 30C is electrically connected to the externally connecting terminals 18 of the power semiconductor modules 10 at the joining parts 32. When connected to the externally connecting terminals 16, 17, and 18, the bus bars 3A, 3B, and 3C are arranged in parallel without contacting each other.

The joining parts 32 of the bus bars 3A, 3B, and 3C and the externally connecting terminals 16, 17, and 18 of the power semiconductor module 10 are electrically connected by joining by means of laser welding. FIGS. 6A, 6B, 7A, 7B, 8A and 8B show schematically the joining places between the joining parts 32 of the bus bars 3A, 3B, and 3C and the externally connecting terminals 16, 17, and 18 of the power semiconductor module 10.

Figure 6A:
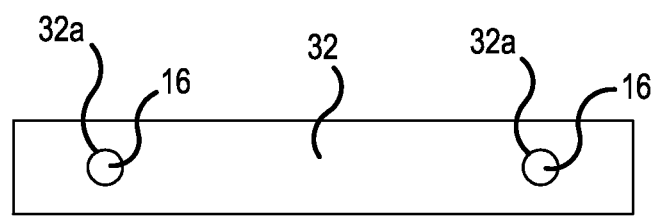
FIG. 6A and FIG. 6B show a configuration of joining between a bus bar and a terminal.
Figure 6B:
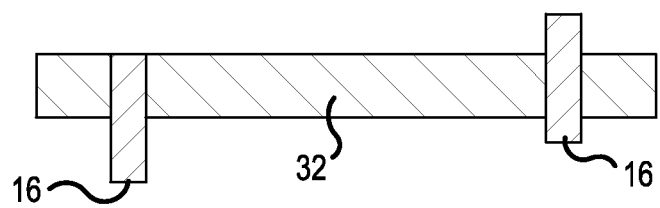

FIGS. 6A and 6B are a plan view and a sectional view, respectively, in which through-holes 32a are formed in the joining part 32 to insert the externally connecting terminals 16 (or 17, 18) through the through-holes 32a. The tip of the externally connecting terminals 16 (or 17, 18) can be placed at the same vertical position as the surface of the joining part 32 as shown in the left side of FIG. 6B or can be placed protruding above the surface of the joining part 32 as shown in the right side of the figure. The laser light is sufficient when irradiated only at two spots on the diameter around the boundary between the through-hole 32a and the externally connecting terminal 16 (or 17, 18). The externally connecting terminals 16 (or 17, 18) are not necessarily completely melted in the through-hole 32a, but irradiation at the two spots gives the joining part enough joint strength and good electrical conductivity. For complete elimination of joint defect, however, it is desirable for the externally connecting terminals 16 (or 17, 18) to be completely melted in the through-holes 32a. The performance of the joint part by means of laser irradiation is affected by the gap between the through-hole 32a and the externally connecting terminal 16 (or 17, 18) as well as the laser output power. Thus, they should be controlled within predetermined limits. For the externally connecting terminals 16 with a diameter of 1.0 mm, for example, the diameter of the through-hole 32a is preferably slightly larger than 1.0 mm, for example, 1.2 mm.

Figure 7A:
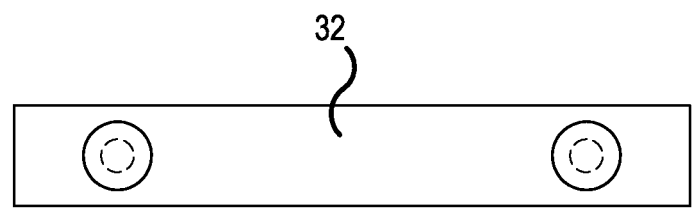
FIG. 7A and FIG. 7B show another configuration of joining between a bus bar and a terminal.
Figure 7B:
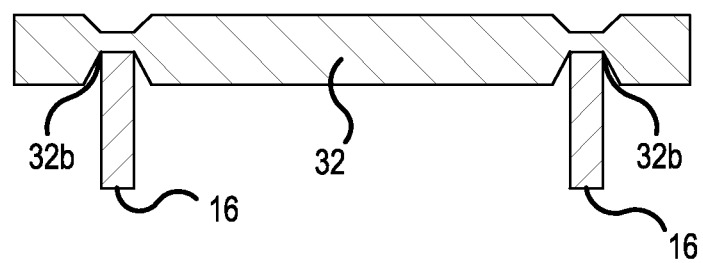

FIGS. 7A and 7B are a plan view and a sectional view, respectively, in which recessed parts 32b are formed on the joining part 32 and the tips of the externally connecting terminals 16 (or 17, 18) are made in contact with the recessed parts 32b. The joining is carried out by irradiating laser light onto the recessed parts 32b from above and the thin part of the recesses 32b is melted and further the tips of the externally connecting terminals 16 (or 17, 18) are also melted to join them.

Figure 8A:
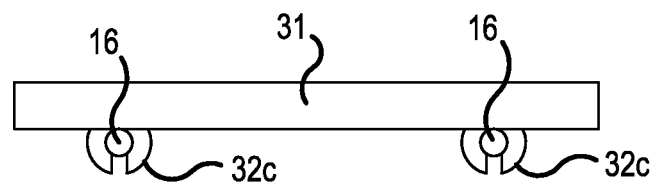
FIG. 8A and FIG. 8B show still another configuration of joining between a bus bar and a terminal.
Figure 8B:
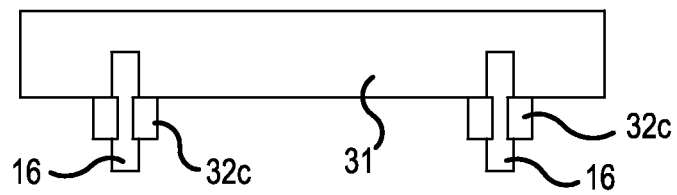

FIGS. 8A and 8B are a plan view and a sectional view, respectively, in which a joining part 32 of grips 32c in the configuration of the letter C is formed for holding the externally connecting terminals 16 (or 17, 18) and the tip portion of the externally connecting terminals 16 (or 17, 18) are inserted through the grips 32c and caulked. Thus, the tip portion of the externally connecting terminals 16 (or 17, 18) is held by the grip 32c made in contact with the side surface of the body part 31 of the bus bar. In this structure, the laser light is irradiated at the contact place between the externally connecting terminals 16 (or 17, 18) and the body part 31, and/or grip 32c to join them.

Laser welding can be carried out in a small space and achieves joining with a local, small amount of heat input even for high thermal conductivity material of copper or copper alloy. The laser welding does not need cleaning of solder flux residue, which is the case in soldering. Therefore, the laser welding is suited for joining in the semiconductor device 1 according to the embodiment of the invention, in which a space for joining is limited, and joining must be conducted between the joining part 32 of the bus bars 3A, 3B, and 3C made of copper or copper alloy and the externally connecting terminals 16, 17, and 18 of the power semiconductor module 10. The laser welding performs joining without thermally affecting the power semiconductor module 10.

The printed circuit board 4 indicated in FIG. 2 is used for electrically connecting specific terminals, other than those connected by the bus bars 3A, 3B, and 3C, of the plurality of power semiconductor modules 10, specifically, the externally connecting terminals 19A, 19B, 19C, and 19D. The printed circuit board 4 has a predetermined circuit pattern for electrical connection to the externally connecting terminals 19A, 19B, 19C, and 19D. The printed circuit board 4 has vertically extending external terminals 40A, 40B, 40C, and 40D connecting to this circuit pattern.

The printed circuit board 4 is long enough to extend over the externally connecting terminals 19A, 19B, 19C, and 19D of the plurality of power semiconductor modules 10 arranged in parallel. The externally connecting terminals 19A of the power semiconductor modules 10 are electrically connected to the external terminal 40A of the printed circuit board 4; the externally connecting terminals 19B are electrically connected to the external terminal 40B; the externally connecting terminals 19C are electrically connected to the external terminal 40C; and the externally connecting terminals 19D are electrically connected to the external terminal 40D.

The printed circuit board 4 is electrically connected to the externally connecting terminals 19A, 19B, 19C, and 19D of the power semiconductor modules 10 by joining by means of laser welding. FIGS. 9A, 9B, 10A, 10B, 11A, and 11B schematically show the joining parts between the printed circuit board 4 and the externally connecting terminals 19A, 19B, 19C, and 19D of the power semiconductor modules 10.

Figure 9A:
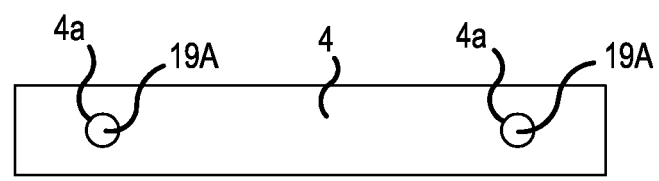
FIG. 9A and FIG. 9B show a configuration of joining between a printed circuit board and a terminal.
Figure 9B:
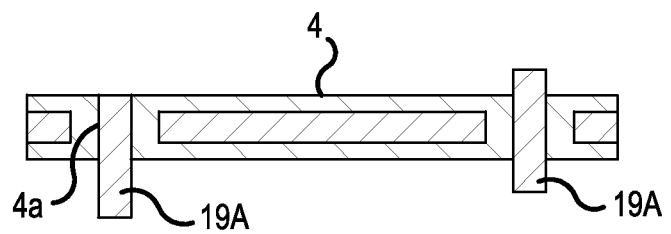

FIGS. 9A and 9B are a plan view and a sectional view, respectively, in which through-holes 4a are formed in the printed circuit board 4 to insert the externally connecting terminals 19A (or 19B, 19C, 19D), and the externally connecting terminals 19A (or 19B, 19C, 19D) are inserted into the through-holes 4a. The tip of the externally connecting terminals 19A (or 19B, 19C, 19D) can be placed at the same vertical position as the surface of the through-hole 4a as shown in the left side of FIG. 9B or can be placed protruding above the surface of the through-hole 4a as shown in the right side of the figure. The laser light is sufficient when irradiated only at two spots on the diameter around the boundary between the through-hole 4a and the externally connecting terminals 19A (or 19B, 19C, 19D). The externally connecting terminals 19A (or 19B, 19C, 19D) are not necessarily completely melted in the through-hole 4a, but irradiation at the two spots gives the joining part enough joint strength and good electrical conductivity. For complete elimination of joint defects, however, it is desirable for the externally connecting terminals 19A (or 19B, 19C, 19D) to be completely melted in the through-holes 4a. The performance of the joint by means of laser irradiation is affected by the gap between the through-hole 4a and the externally connecting terminal 19A (or 19B, 19C, 19D) as well as the laser output power. Thus, they should be controlled within predetermined limits. For an externally connecting terminal 19A with a diameter of 1.0 mm, for example, the diameter of the through-hole 4a is preferably slightly larger than 1.0 mm, for example, 1.2 mm.

Figure 10A:
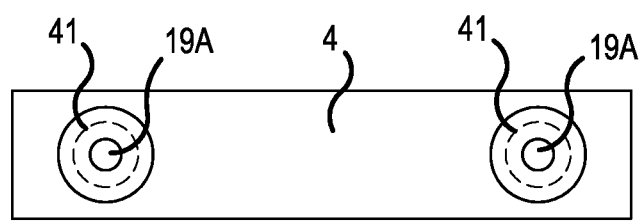
FIG. 10A and FIG. 10B show another configuration of joining between a printed circuit board and a terminal.
Figure 10B:
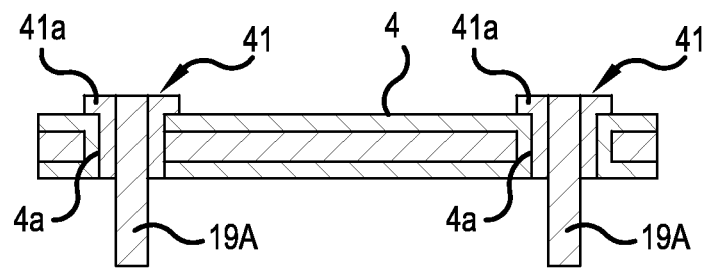

FIGS. 10A and 10B are a plan view and a sectional view in which through-holes 4a are formed in the printed circuit board 4 and intermediate pins 41 with a shape of a circular pipe are inserted through the through-holes 4a. The externally connecting terminals 19A (or 19B, 19C, 19D) are inserted through the intermediate pins 41. The intermediate pin 41 has a flange 41a formed at the top thereof and the flange 41a prevents the intermediate pin 41 from falling down the through-hole 4a. Laser light is sufficiently irradiated at two spots on the diameter around the boundary between the intermediate pin 41 and the externally connecting terminal 19A.

Figure 11A:
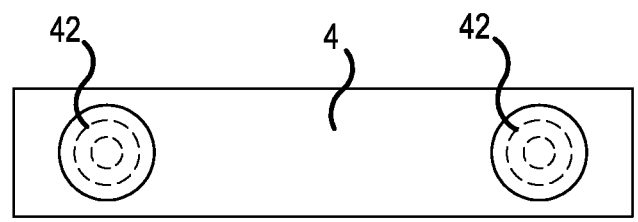
FIG. 11A and FIG. 11B show still another configuration of joining between a printed circuit board and a terminal.
Figure 11B:
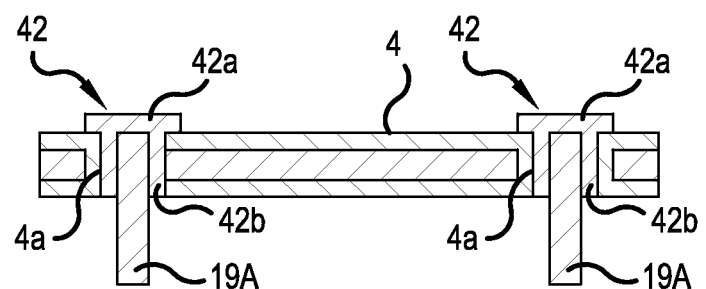

FIGS. 11A and 11B are a plan view and a sectional view in which through-holes 4a are formed in the printed circuit board 4 and intermediate pins 42 with a shape of a circular pipe are inserted through the through-holes 4a. The externally connecting terminals 19A (or 19B, 19C, 19D) are inserted into the intermediate pins 42. The intermediate pin 42 has a lid 42a at the top thereof, and a circular pipe part 42b is joined to the back surface of the lid 42a. The diameter of the lid 42a is larger than that of the through-hole 4a so that the intermediate pin 42 does not fall down the through-hole 4a. The tip of the externally connecting terminal 19A (or 19B, 19C, 19D) is placed inside the circular pipe portion of the intermediate pin 42 and contacts the back surface of the lid 42a. In this structure, laser light is irradiated from above the intermediate pin 42 onto the lid 42a of the intermediate pin 42 and melts the lid 42a, and further melts the tip of the externally connecting terminal 19A (or 19B, 19C, 19D) to perform joining.

The surface of the through-hole 4a of the printed circuit board 4 and the surfaces of the intermediate pins 41 and 42 preferably are plated. The plating enhances the absorption coefficient for laser light to facilitate laser welding. The output power for welding is reduced and the selection range for welding devices is expanded, restraining equipment costs. The types of plating include nickel plating, nickel alloy plating, gold plating, silver plating, copper alloy plating, chrome plating, and iron plating. Among them, nickel plating is preferable.

Laser welding can be carried out in a small space and achieves joining with a local, small amount of heat input even for high thermal conductivity material of copper or copper alloy. The laser welding does not need cleaning of solder flux residue, which is the case in soldering. Therefore, the laser welding is suited for joining in the semiconductor device 1 according to the embodiment of the invention, in which a space for joining is limited, and joining must be conducted between the printed circuit board 4 having the through-holes and circuit pattern made of copper or copper alloy and the externally connecting terminals 19A, 19B, 19C, and 19D of the power semiconductor module 10. The laser welding performs joining without thermally affecting the power semiconductor module 10.

The semiconductor module case 2 shown in FIG. 2 has holes 2h and holes 2i, in which the holes 2h are provided to project out the external terminals 30A, 30B, and 30C that are terminal portions 33 of the bus bars 3A, 3B, and 3C to outside of the semiconductor module case 2, while the holes 2i are provided to project the external terminals 40A, 40B, 40C, and 40D provided on the printed circuit board 4 to outside of the semiconductor module case 2.

Figure 12:
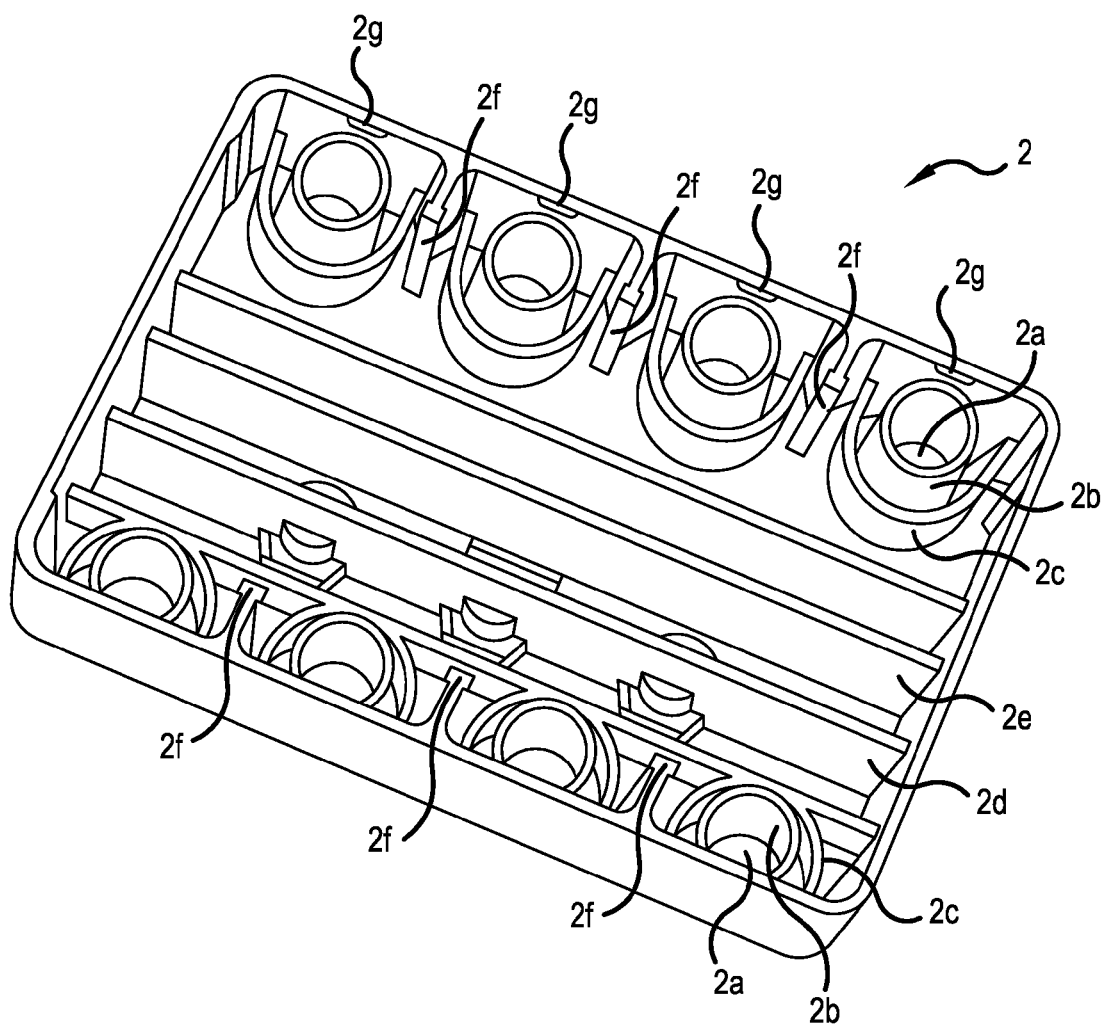
FIG. 12 is a perspective view of a semiconductor module case composing a semiconductor device according to an embodiment of the present invention.

FIG. 12 is a perspective view of the semiconductor module case 2 seen from the back side thereof. The semiconductor module case 2 is provided with a multiple of, four in the example of FIG. 12, fitting holes 2a corresponding to the fitting holes 10a of the four power semiconductor modules 10. Around the fitting holes 2a, an insulating rib 2b with a shape of a circular pipe and an insulating rib 2c with a shape of a semicircular pipe are formed. The insulating ribs 2b and 2c prolong the insulation distance between a bolt (not shown in any figures) for fastening the semiconductor device 1 to another device to be assembled with the semiconductor device 1 and the conductive parts of the semiconductor device 1. The bolt is inserted through the fitting hole 2a and fastened at the fitting hole 10a of the power semiconductor module 10. The conductive parts that have to be separated from the bolt include the externally connecting terminals 16, 17, 18, 19A, 19B, 19C, and 19D of the power semiconductor module 10, bus bars 3A, 3B, and 3C, and the printed circuit board 4.

The semiconductor module case 2 has, in the back side thereof, a straight extending insulating rib 2d positioned between the bus bar 3A and the bus bar 3B when a plurality of power semiconductor modules 10 connected with the bus bars are installed in position. This straight extending insulating rib 2d prolongs the insulating distance between the bus bar 3A and the bus bar 3B. The semiconductor module case 2 also has a straight extending insulating rib 2e that becomes positioned between the bus bar 3B and the bus bar 3C when a plurality of power semiconductor modules 10 connected with the bus bars are installed in position. This straight extending insulating rib 2e prolongs the insulating distance between the bus bar 3B and the bus bar 3C.

In the back side of the semiconductor module case 2, guide ribs 2f are formed at positions between adjacent power semiconductor modules 10 for guiding the power semiconductor modules 10 during the plurality of power semiconductor modules 10 being installed in parallel arrangement. The guide rib 2f extends along the guide groove 10f formed on the side surface 10c of the power semiconductor module 10 and has a shape which allows a slidable fitting to the groove 10f.

In the back side of the semiconductor module case 2, protruding parts 2g are formed to engage with recessed parts 10g formed on both shorter side walls 10e of the semiconductor module case 2.

Figure 13A:
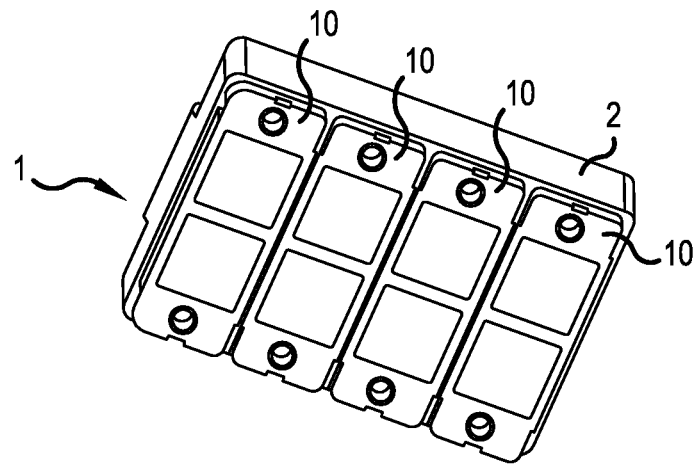
FIG. 13A and FIG. 13B are perspective views showing an intermediate state in the process of inserting power semiconductor modules into a semiconductor module case.
Figure 13B:
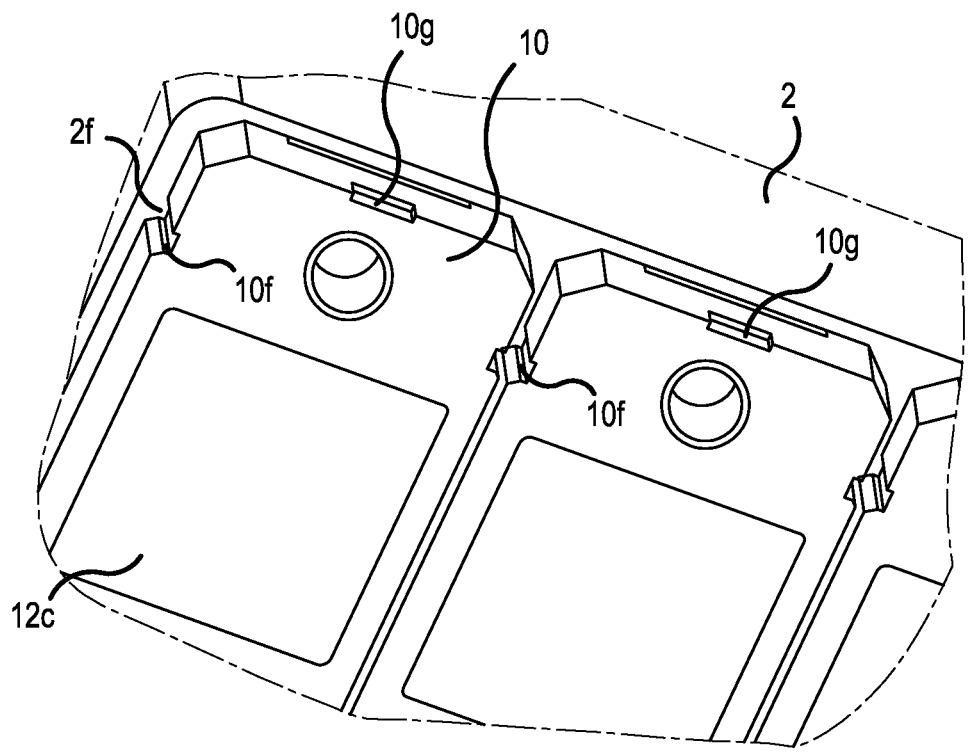

FIGS. 13A and 13B are perspective views during a process of installing the plurality of power semiconductor modules 10 into the semiconductor module case 2, in which FIG. 13A is a perspective view of whole the semiconductor device and FIG. 13B is a partly enlarged perspective view of FIG. 13A. As shown in the figures, power semiconductor modules 10 are installed into the semiconductor module case 2 guided with the guide rib 2f extending along the guide groove 10f. When the power semiconductor modules 10 are entirely installed into the semiconductor module case 2, the protruding part 2g of the semiconductor module case 2 engages with recessed part 10g provided on the shorter side wall of the power semiconductor module 10. In other words, a snap-fitting structure is formed by the protruding part 2g of the semiconductor module case 2 and the recessed part 10g of the power semiconductor module 10. Thus, the power semiconductor modules 10 are fixed to the semiconductor module case 2 without any screw or adhesive. The semiconductor module case 2 is molded with a resin exhibiting such elasticity that enables this snap-fitting structure to work.

Figure 14:
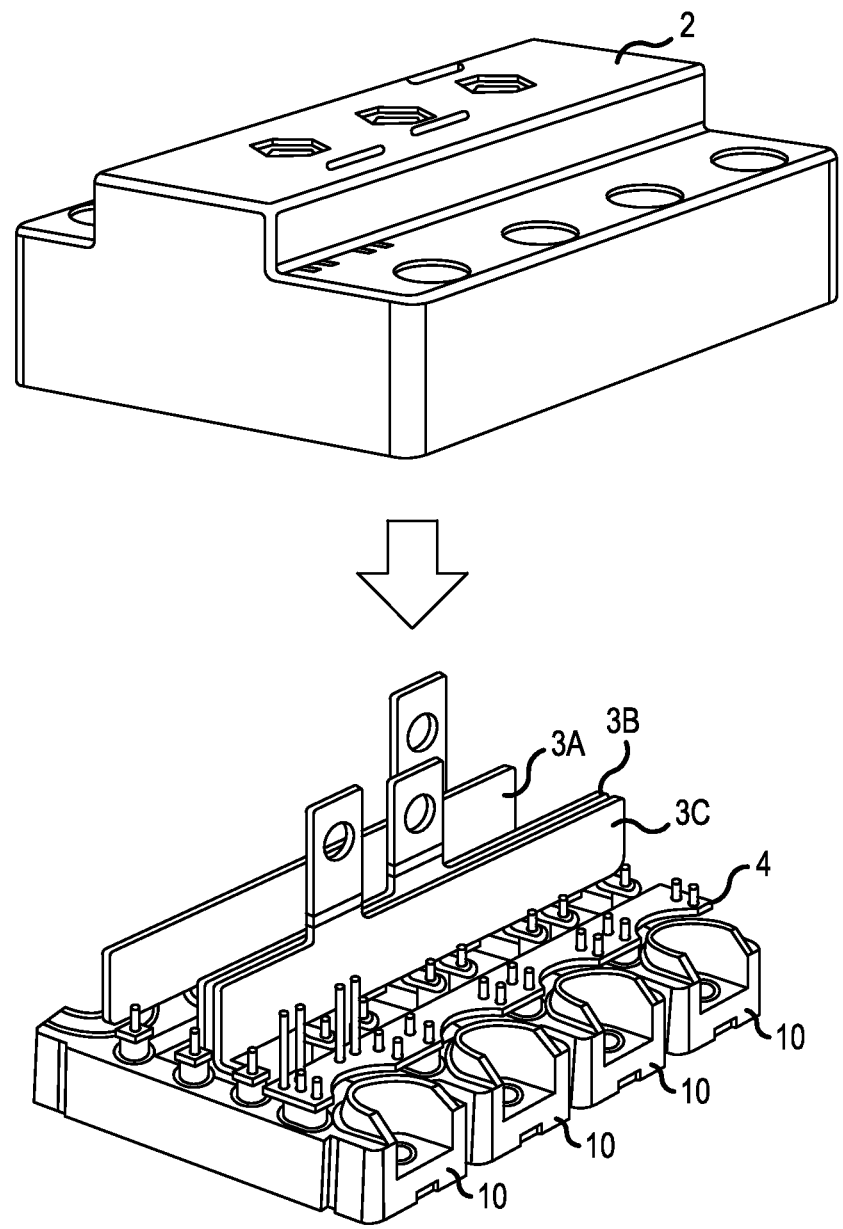
FIG. 14 illustrates an assembly process of a semiconductor device according to an embodiment of the invention.

FIG. 14 illustrates an assembly process of a semiconductor device 1 having the components shown in the exploded view of FIG. 2. First, four power semiconductor modules 10, in the example of FIG. 14, are arranged in parallel. Then, the bus bars 3A, 3B, and 3C are joined to the externally connecting terminals 16, 17, and 18 of the power semiconductor modules 10 by means of laser welding; and the printed circuit board 4 is joined to the externally connecting terminals 19A, 19B, 19C, and 19D by means of laser welding. Then, the semiconductor module case 2 is placed to cover the power semiconductor modules 10, the bus bars 3A, 3B, and 3C, and the printed circuit board 4, and the protrusion 2g of the semiconductor module case 2 is engaged with the recessed part 10g of the power semiconductor module 10 to fix them. In this process, the external terminals 30A, 30B, and 30C lead out of the semiconductor module case 2 through the through-holes 2h, and then are folded in the horizontal direction. The external terminals 40A, 40B, 40C, and 40D lead out through the through-holes 2i of the semiconductor module case 2. Because the external terminals 30A, 30B, and 30C and the external terminals 40A, 40B, 40C, and 40D are not fixed to the semiconductor module case 2, they can be led out without generating any damage on the semiconductor module case 2.

Figure 15:
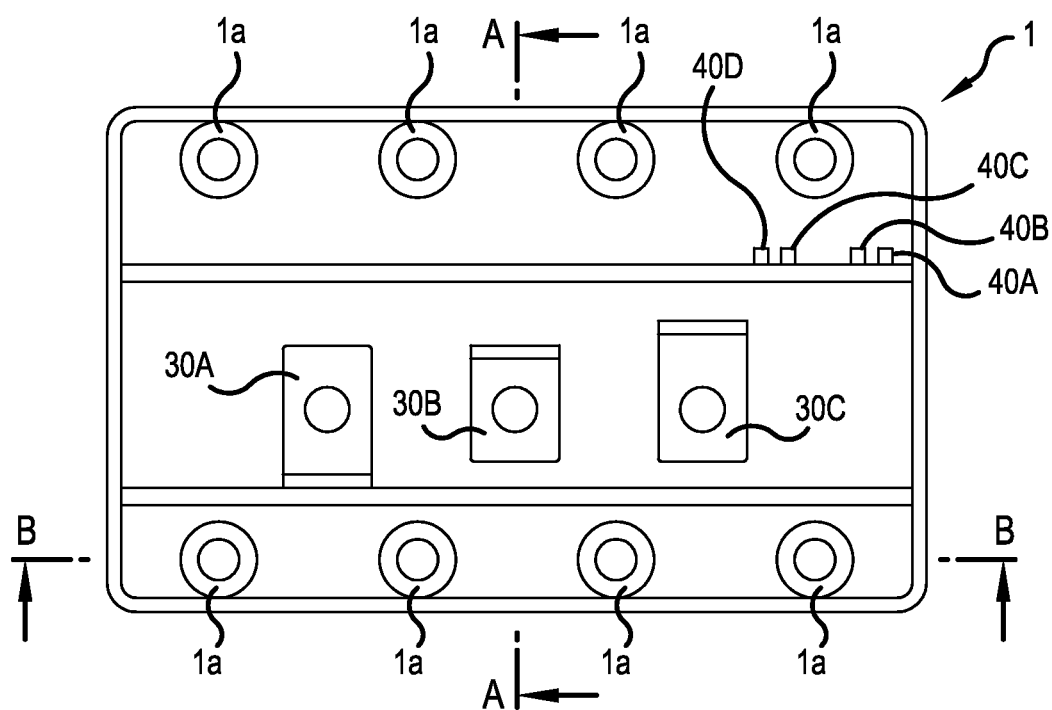
FIG. 15 is a plan view of a semiconductor device according to an embodiment of the invention.
Figure 16:
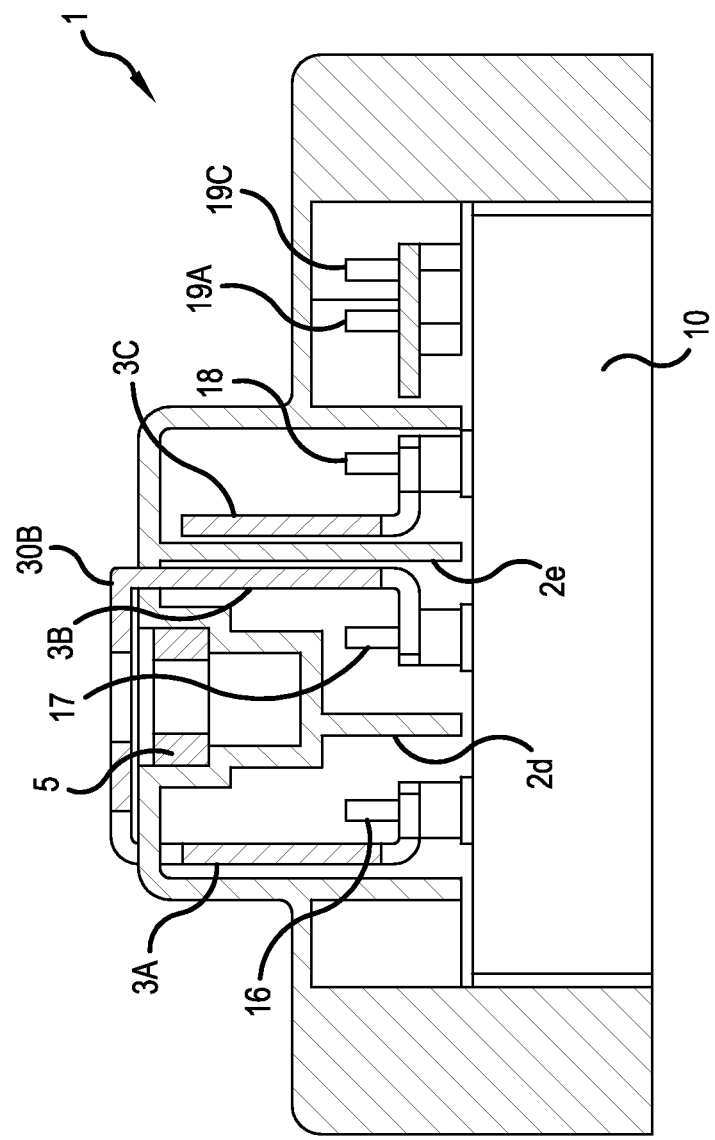
FIG. 16 is a sectional view cut along the line A-A of the semiconductor device shown in FIG. 15.
Figure 17:
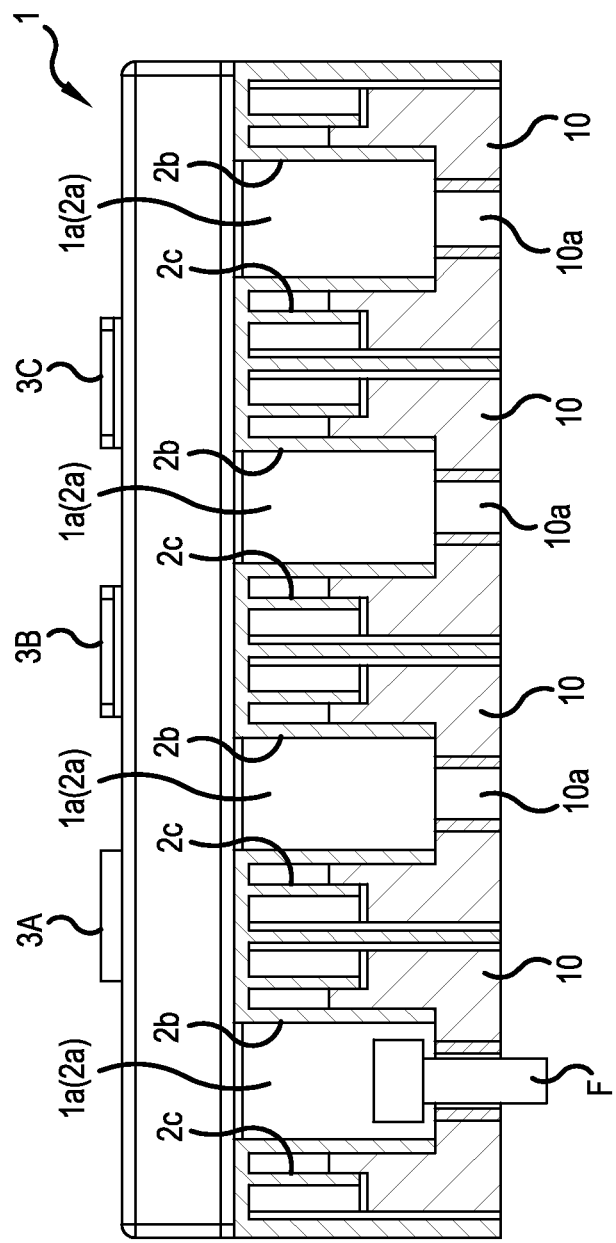
FIG. 17 is a sectional view cut along the line B-B of the semiconductor device shown in FIG. 15.

FIG. 15 is a plan view of the semiconductor device 1; FIG. 16 is a sectional view of the semiconductor device 1 cut along the line A-A in FIG. 15; and FIG. 17 is a sectional view of the semiconductor device 1 cut along the line B-B in FIG. 15. As shown in FIG. 16, the insulating rib 2d is interposed between the bus bar 3A and the bus bar 3B, and the insulating rib 2e is interposed between the bus bar 3B and the bus bar 3C, the insulating ribs being formed in the back surface side of the semiconductor module case 2. Thus, the insulation distances for the bus bars 3A, 3B, and 3B are ensured. As shown in FIG. 17, surrounding a fastening means F such as a bolt or a screw inserted into the fitting hole 1a to fasten the semiconductor device 1, an insulating rib 2b with a circular pipe shape and an insulating rib 2c with a semicircular pipe shape are provided in the back surface side of the semiconductor module case 2. These insulating ribs ensure the insulation distance between the bolt or screw and the bus bars 3A, 2B, and 3C without filling inside the semiconductor module case 2 with filler material such as gel.

A semiconductor device 1 according to the embodiment achieves high current carrying capacity by combining a plurality of power semiconductor modules 10, and thus exhibits high yield rate. The semiconductor device 1 of the invention, having the similar configuration of external shape and lead out terminals to the conventional one, does not require substantial modification in the side of a device that uses the semiconductor device 1. Because of the simple fastening procedure between the semiconductor module case 2 and the power semiconductor module 10 and no need for sealing with gel, even if one power semiconductor module 10 is broken, the accident can be dealt with by simply replacing the power semiconductor module 10, and the replacement can be carried out easily. The precision in assembling the semiconductor device is approximately equal to the one in the case of assembling the power semiconductor modules 10 independently on each other. Consequently, cooling fins can be attached to the semiconductor device 1 with such control of flatness of the bottom surface of the semiconductor device 1 and of uniform contact with the cooling fins that is equivalent to the control for individual power semiconductor module 10. The semiconductor device 1, being without gel sealing and not a large sized resin mold, readily can be employed to a semiconductor device for use at chip temperatures above 200° C. In the semiconductor device 1, laser welding is employed for connecting the bus bars 3A, 3B, and 3C and the externally connecting terminals 16, 17, and 18, and for connecting the printed circuit board 4 and the externally connecting terminals 19A, 19B, 19C, and 19D. Consequently, the connection can be carried out in a small space, and the connection between high thermal conductivity materials of copper or copper alloy can be conducted without adversely affecting the power semiconductor module 10. Thus a step of removing solder flux residue is eliminated, which would be necessary in the joining by means of soldering.

Thus, a semiconductor device has been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

DESCRIPTION OF SYMBOLS

1: semiconductor device
2: semiconductor module case 3A, 3B, 3C: bus bar
4: printed circuit board
10: power semiconductor module
11: semiconductor chip
12A, 12B insulated circuit board
16, 17, 18: externally connecting terminal
19A, 19B, 19C, 19D: externally connecting terminal
20: casing
30A, 30B, 30C: external terminal
40A, 40B, 40C, 40D: external terminal

What is claimed is:

1. A semiconductor device comprising:
a plurality of semiconductor modules, each having one or more semiconductor chips mounted on an insulated circuit board and contained in a casing, with externally connecting terminals connected to the semiconductor chips or the insulated circuit board protruding from the casing;
bus bars electrically connecting specific externally connecting terminals of the plurality of semiconductor modules arranged in parallel; and
a semiconductor module case having through-holes for protruding external terminals that are portions of the bus bars, and covering and fastening the plurality of semiconductor modules that are connected by the bus bars;
wherein the bus bars and the externally connecting terminals of the semiconductor modules are connected by means of laser welding.

2. The semiconductor device according to claim 1, wherein the bus bar has through-holes capable of passing the externally connecting terminals through the through-holes, or recessed parts for making the terminals contact the recessed parts or grips for holding the terminals.

3. The semiconductor device according to claim 2, wherein the bus bar is plated at least on a place at which the laser welding is conducted.

4. The semiconductor device according to claim 1, wherein the bus bar is plated at least on a place at which the laser welding is conducted.

5. A semiconductor device comprising:
a plurality of semiconductor modules, each having one or more semiconductor chips mounted on an insulated circuit board and contained in a casing, with externally connecting terminals connected to the semiconductor chips or the insulated circuit board protruding from the casing;
bus bars electrically connecting specific externally connecting terminals of the plurality of semiconductor modules arranged in parallel;
a printed circuit board electrically connecting specific externally connecting terminals of the plurality of semiconductor modules, the specific externally connecting terminals being different from the externally connecting terminals connected to the bus bars; and
a semiconductor module case having through-holes for protruding external terminals that are portions of the bus bars, and covering and fastening the plurality of semiconductor modules that are connected by the bus bars;
wherein the printed circuit board and the externally connecting terminals of the semiconductor modules are connected by means of laser welding.

6. The semiconductor device according to claim 5, wherein the printed circuit board has through-holes that allow the externally connecting terminals passing through the through-holes, or intermediate pins that are inserted into the through-holes and capable of passing the terminals through the intermediate pins or capable of making the terminals in contact with the intermediate pins.

7. The semiconductor device according to claim 6, wherein the printed circuit board is plated at least on a place at which the laser welding is conducted.

8. The semiconductor device according to claim 5, wherein the printed circuit board is plated at least on a place at which the laser welding is conducted.

* * * * *